(12) United States Patent
Wu (10) Patent No.: US 12,550,503 B2
(45) Date of Patent: Feb. 10, 2026

(54) MANUFACTURING METHOD OF DISPLAY PANEL AND DISPLAY PANEL

(71) Applicant: TCL CHINA STAR OPTOELECTRONICS TECHNOLOGY CO., LTD., Guangdong (CN)

(72) Inventor: Wanchun Wu, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 710 days.

(21) Appl. No.: 17/618,891

(22) PCT Filed: Nov. 15, 2021

(86) PCT No.: PCT/CN2021/130718
§ 371 (c)(1),
(2) Date: Dec. 14, 2021

(87) PCT Pub. No.: WO2023/040029
PCT Pub. Date: Mar. 23, 2023

(65) Prior Publication Data
US 2024/0063353 A1 Feb. 22, 2024

(30) Foreign Application Priority Data
Sep. 17, 2021 (CN) .......................... 202111093348.6

(51) Int. Cl.
*H10H 20/857* (2025.01)
*H10H 20/819* (2025.01)
*H10H 20/01* (2025.01)

(52) U.S. Cl.
CPC ........ *H10H 20/857* (2025.01); *H10H 20/819* (2025.01); *H10H 20/0364* (2025.01)

(58) Field of Classification Search
None
See application file for complete search history.

(56) References Cited

U.S. PATENT DOCUMENTS 6,159,754 A * 12/2000 Li ..................... H01L 21/76898
257/E21.597
8,537,527 B2 * 9/2013 Aoyagi .................. H05K 1/112
438/257

(Continued)

FOREIGN PATENT DOCUMENTS

| CN | 104465319 A | 3/2015 |
|---|---|---|
| CN | 107861656 A | 3/2018 |

(Continued)

OTHER PUBLICATIONS

International Search Report in International application No. PCT/CN2021/130718,mailed on Jun. 15, 2022.

(Continued)

*Primary Examiner* — David P Turocy
(74) *Attorney, Agent, or Firm* — PV IP PC; Wei Te Chung (57) ABSTRACT

A manufacturing method of a display panel and a display panel are disclosed. In the manufacturing method of the display panel, a film is formed on a substrate, and a slit is formed on the film, and then a metal film is formed on the film and is deposited on a surface of the substrate through the silt. After tearing the film and the metal film therewith, the metal film deposited on the surface of the substrate can form a metal line on the surface of the substrate to improve the transfer efficiency of the metal in the metal film to the surface of the substrate to form the metal line, and shorten the process time.

10 Claims, 7 Drawing Sheets

(56) References Cited

U.S. PATENT DOCUMENTS

| | | | | |
|---|---|---|---|---|
| 2010/0111509 A1* | 5/2010 | Guan | ...................... | H05B 3/10 |
| | | | | 392/311 |
| 2015/0207108 A1 | 7/2015 | Choi et al. | | |
| 2015/0286318 A1* | 10/2015 | Morein | ................ | G06F 3/0446 |
| | | | | 345/174 |
| 2016/0116799 A1* | 4/2016 | Jang | ......................... | G03F 7/16 |
| | | | | 438/23 |

FOREIGN PATENT DOCUMENTS

| | | | | | |
|---|---|---|---|---|---|
| CN | 108598133 | A | | 9/2018 | |
| CN | 109301085 | A | | 2/2019 | |
| CN | 109427243 | A | | 3/2019 | |
| CN | 113053940 | A | * | 6/2021 | ........... H01L 25/167 |
| TW | 201639000 | A | | 11/2016 | |
| WO | WO-2018063336 | A1 | * | 4/2018 | ......... H01L 21/7682 |

OTHER PUBLICATIONS

Written Opinion of the International Search Authority in International application No. PCT/CN2021/130718, mailed on Jun. 15, 2022.

Chinese Office Action issued in corresponding Chinese Patent Application No. 202111093348.6 dated Jul. 22, 2022, pp. 1-5.

Chinese Office Action issued in corresponding Chinese Patent Application No. 202111093348.6 dated Apr. 5, 2023, pp. 1-5.

* cited by examiner

MANUFACTURING METHOD OF DISPLAY PANEL AND DISPLAY PANEL

FIELD OF THE INVENTION

The present application relates to a display technology field, and more particularly to a manufacturing method of a display panel and the display panel.

BACKGROUND OF THE INVENTION

Before the step of transferring the Micro LED (micro light emitting diode) to the substrate, it is necessary to first form metal lines on the surface and sides of the substrate. At present, the formation method of the metal lines is to coat the surface and side of the substrate with silver paste. The silver paste is cured by laser, and then is laser engraved after curing to finally form the required metal lines. The laser engraving method is complicated at present. When engraving, the front engraving is implemented first, and then the side engraving is implemented, which requires two times of laser engravings.

Moreover, the engraving is implemented directly on the surface of the silver paste and the engraving method is complicated. The line width of the formed metal line needs to be accurately controlled, and it is also necessary to ensure that the metal line formed by the front engraving and the metal line formed by the side engraving are accurately aligned. Furthermore, as implementing the laser engraving, there is a risk that the laser breaks through the silver paste and damages the surface of the substrate, which increases the accuracy requirements for laser engraving, resulting in a long tact time. In addition, a large amount of heat is concentrated on the silver paste during laser engraving. In order to avoid the high temperature damage to the film formed by the silver paste, it is necessary to adopt high temperature resistant silver paste, which leads to an increase in the production cost of the silver paste.

SUMMARY OF THE INVENTION

The embodiment of the present invention provides a manufacturing method of a display panel to solve the problem that the direct laser engraving on the surface of the silver paste resulting the long process time in the existing metal line forming method.

The embodiment of the present invention provides a manufacturing method of a display panel, comprising following steps:
providing a substrate;
forming a film on a surface of the substrate;
forming at least one slit on at least one side of a surface of the film, and the slit exposes at least part of the surface of the substrate;
forming a metal film on the surface of the film, and the metal film corresponding to the slit is deposited on the surface of the substrate to form a metal line;
removing the film.

Optionally, the substrate comprises an active area and a non-active area located outside the active area; the step of forming the at least one slit on the at least one side of the surface of the film comprises: forming at least one slit on at least one side of the surface of the film corresponding to the non-active area; a shape of the slit is a strip hole arranged along a first direction.

Optionally, the shape of the slit is a groove arranged on a side of the film along the first direction.

Optionally, a number of the slits is multiple, which are formed on the surface of the film at intervals along a second direction, and the second direction is perpendicular to the first direction.

Optionally, at least one through hole is further formed on the surface of the film corresponding to the non-active area, and the through hole exposes at least part of the non-active area of the surface of the substrate, and the through hole communicates with at least part of inside of the slits.

Optionally, the step of forming the film on the surface of the substrate further comprises forming positioning marks at positions of at least two corners of the surface of the film.

Optionally, the manufacturing method further comprises forming alignment marks corresponding to the positioning marks on the surface of the substrate.

Optionally, the film comprises a protective layer and a glue layer that are stacked, and the protective layer is formed on the surface of the substrate through the glue layer.

Optionally, a metal forming the metal film is selected from one of molybdenum, copper, molybdenum-titanium alloy or silver.

The embodiment of the present invention further provides a display panel comprising a substrate, wherein the substrate comprises an active area and a non-active area located outside the active area; at least one metal line, deposited in the non-active area, wherein one end of the metal line is connected to the active area and one end of the metal line away from the active area extends to a side of the substrate; wherein at least one conducting line is formed on a side wall of the substrate adjacent to the metal line, and one end of the conducting line is connected to the metal line.

Optionally, at least one bonding line is deposited in the non-active area between the metal line and the active area, and the metal line is connected to the active area through the bonding line.

Optionally, a number of the bonding lines is multiple, and the bonding lines are arranged at intervals, and one of the bonding lines is connected to at least two adjacent metal lines.

Optionally, a pair of alignment marks are respectively provided at positions of at least two corners of the surface of the substrate, and the alignment marks is located outside the metal lines.

Optionally, the non-active area is in a shape of a box, a concave frame, an L-shaped frame or a straight shape.

The benefits of the present invention are that in the manufacturing method of the display panel provided by the present invention, a film is formed on a substrate, and a slit is formed on the film, and then a metal film is formed on the film and is deposited on a surface of the substrate through the silt. After tearing the film and the metal film therewith, the metal film deposited on the surface of the substrate can form a metal line on the surface of the substrate, thereby avoiding the process of forming the metal line directly on the surface of silver paste by laser engraving, thus to improve the transfer efficiency of the metal in the metal film to the surface of the substrate to form the metal line, and meanwhile, to avoid damaging the surface of the substrate, simplify the manufacturing process and shorten the process time.

BRIEF DESCRIPTION OF THE DRAWINGS

The technical solution and the beneficial effects of the present invention are best understood from the following detailed description with reference to the accompanying figures and embodiments.

The numbers of the parts in the figures are as follows:
100 substrate, 100a active area, 100b non-active area, 101, 101', 101" metal line, 110, 110', 110" film, 111, 111' slit, 111a through hole, 112 protective layer, 113 glue layer, 114 release film, 115 positioning mark, 120 metal film; 200 roller

DETAILED DESCRIPTION OF PREFERRED EMBODIMENTS

For better explaining the technical solution and the effect of the present invention, the present invention will be further described in detail with the accompanying drawings in the specific embodiments. It is clear that the described embodiments are merely part of embodiments of the present invention, but not all embodiments. Based on the embodiments of the present invention, all other embodiments to those of skilled in the premise of no creative efforts obtained, should be considered within the scope of protection of the present invention.

The invention relates to a manufacturing method of a display panel and a display panel. In the manufacturing method of the display panel, a film is formed on a substrate, and a slit is formed on the film, and then a metal film is formed on the film and is deposited on a surface of the substrate through the silt. After tearing the film and the metal film therewith, the metal film deposited on the surface of the substrate can form a metal line on the surface of the substrate, thereby avoiding the method of forming the metal line directly on the surface of silver paste or metal film by laser engraving, thus to improve the transfer efficiency of the metal in the metal film to the surface of the substrate to form the metal line, and shorten the process time. As a typical application, the manufacturing method of the display panel of the present invention can be applied to the manufacturing of the display panel. The manufactured display panel can be applied to mobile terminals, such as Micro LED displays. The mobile terminal comprises a terminal body and a display panel. The mobile terminal can be any product or component with display functions, such as a mobile phone, a tablet computer, a television, a display, a notebook computer, a digital photo frame, a navigator and the like.

Figure 1:
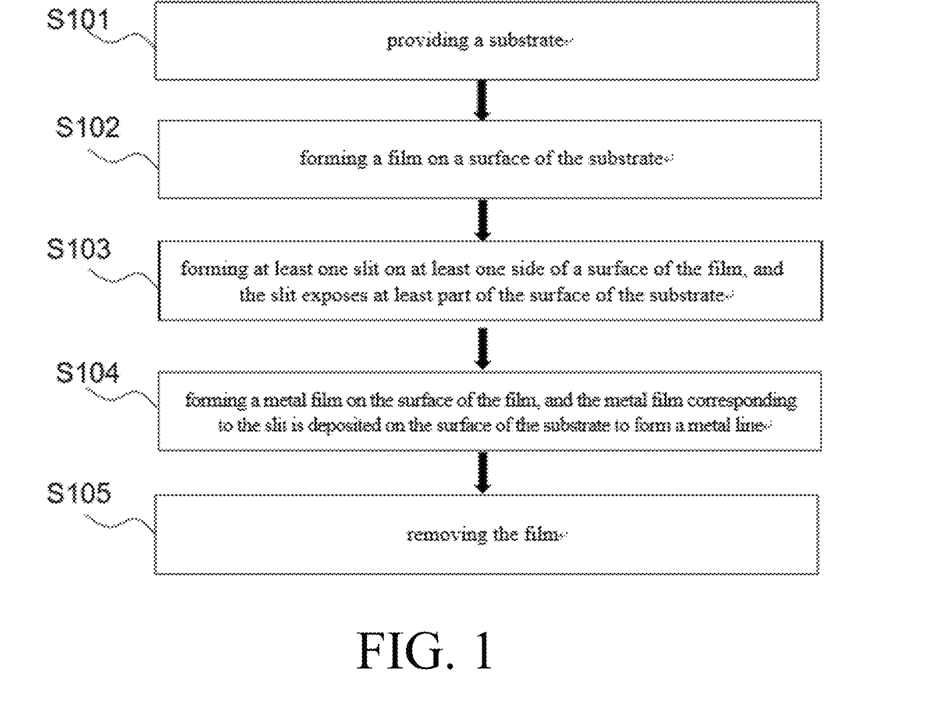
FIG. 1 is a flowchart of a manufacturing method of a display panel provided by an exemplary embodiment of the present invention.

Please refer to FIG. 1 and FIG. 2a to FIG. 2e. In one embodiment of the present invention, the manufacturing method of the display panel comprises following steps:

step S101, providing a substrate 100;

step S102, forming a film 110 on a surface of the substrate 100;

step S103, forming at least one slit 111 on at least one side of a surface of the film 110, and the slit 111 exposes at least part of the surface of the substrate 100;

step S104, forming a metal film 120 on the surface of the film 110, and the metal film 120 corresponding to the slit 111 is deposited on the surface of the substrate 100 to form a metal line 101;

step S105, removing the film 110.

Figure 3A:
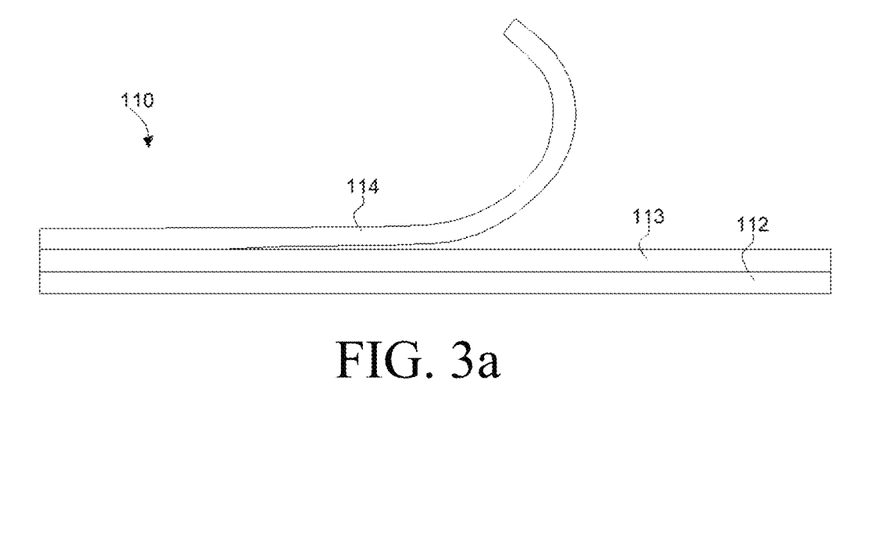
FIG. 3a to FIG. 3c are structural diagrams of assembly of a film and a substrate in a manufacturing method of a display panel provided by an exemplary embodiment of the present invention.
Figure 3B:
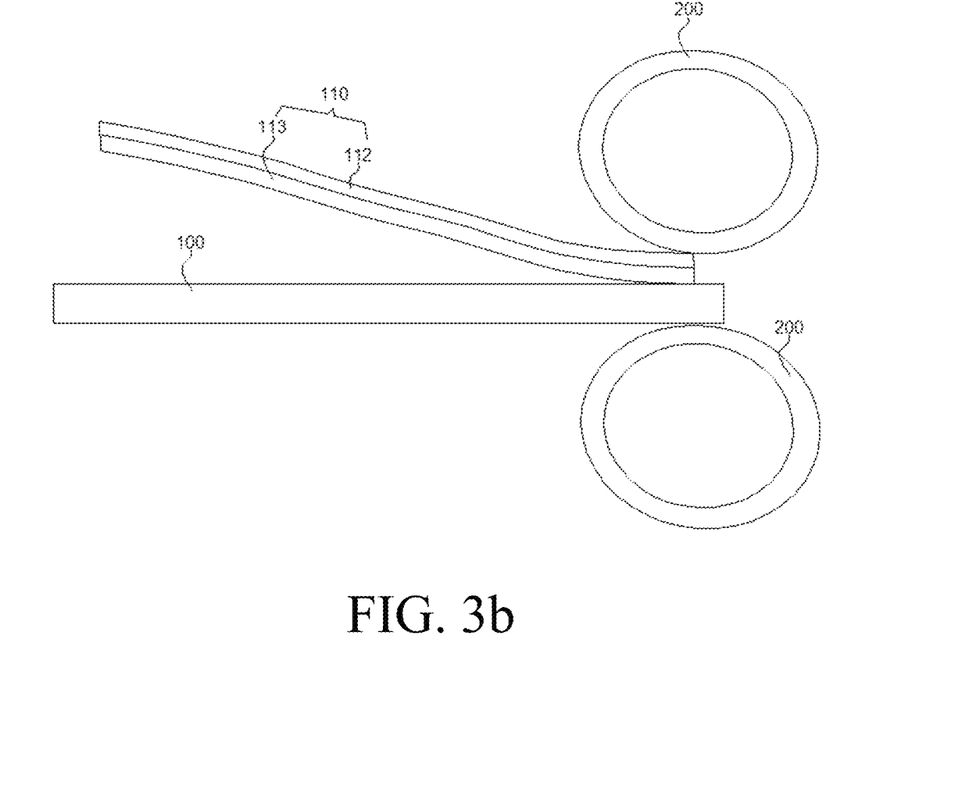
Figure 3C:
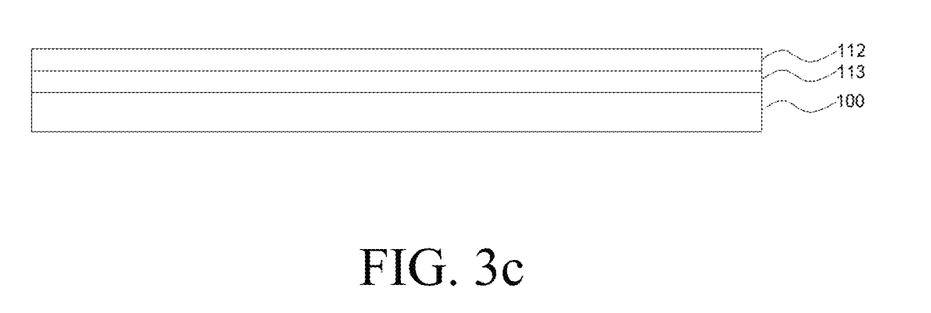

In this embodiment, referring to FIG. 3a to FIG. 3c, the step of forming the film 110 on the surface of the substrate 100 comprises:

preparing the film 110, and the film 110 comprises a protective layer 112 and a glue layer 113 that are stacked, and the glue layer 113 is provided with a release film 114 on the side of the glue layer 113 away from the protective layer 112;

tearing off the release film 114 to expose the glue layer 113;

laminating the film 110 after tearing off the release film 114 on the surface of the substrate 100 through the adhesive layer 113;

bonding the laminated film 110 and the substrate 100 to each other by a soft-to-hard bonding method.

The protective layer 112 is a PI (polyimide) film or a PET (polyethylene terephthalate) film.

In this embodiment, the soft-to-hard bonding method is achieved by a soft-to-hard bonding apparatus. The soft-to-hard bonding equipment comprises two oppositely arranged rollers 200, and the two rollers 200 rotate relative to each other to press and bond the film 110 and the substrate 100 passing therebetween. As another way, the film 110 and the substrate 100 can be assembled by vacuum bonding.

In this embodiment, the slits 111 in the step of forming the at least one slit 111 on the at least one side of the surface of the film 110 are formed by laser. In the step of forming the metal film 120 on the surface of the film 110, the metal film 120 is formed by physical vapor deposition (PVD).

A metal forming the metal film 120 is selected from one of molybdenum, copper, molybdenum-titanium alloy and silver. Specifically in this embodiment, silver paste is selected as the metal film 120, and the metal film 120 is formed by depositing the silver paste on the surface of the film 110 by PVD. During the deposition, part of the metal film 120 (silver paste) is deposited on the surface of the substrate 100 through the slit 111. After the deposition is finished, curing is implemented to cure the metal film 120 (silver paste) deposited on the surface of the substrate 100 to form the metal lines 101 on the surface of the substrate 100. In the step of removing the film 110, the tearing off method is physical tearing to remove the film 110 and meanwhile to tear off the metal film 120 deposited on the surface of the substrate 100. The metal film 120 deposited on the surface of the substrate 100 through the slit 111 remains on the surface of the substrate 100 to form the metal lines 101.

Figure 2A:
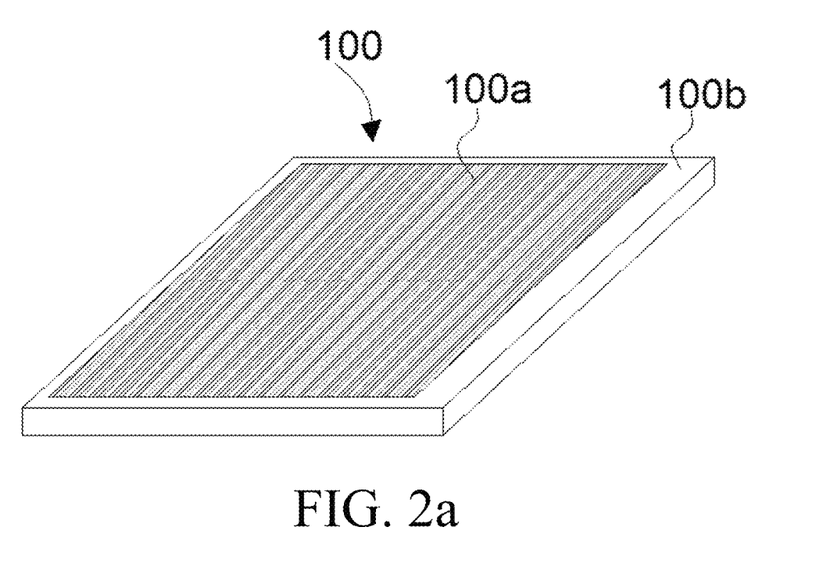
FIG. 2a to FIG. 2e are structural diagrams of a manufacturing method of a display panel provided by an exemplary embodiment of the present invention.
Figure 2B:
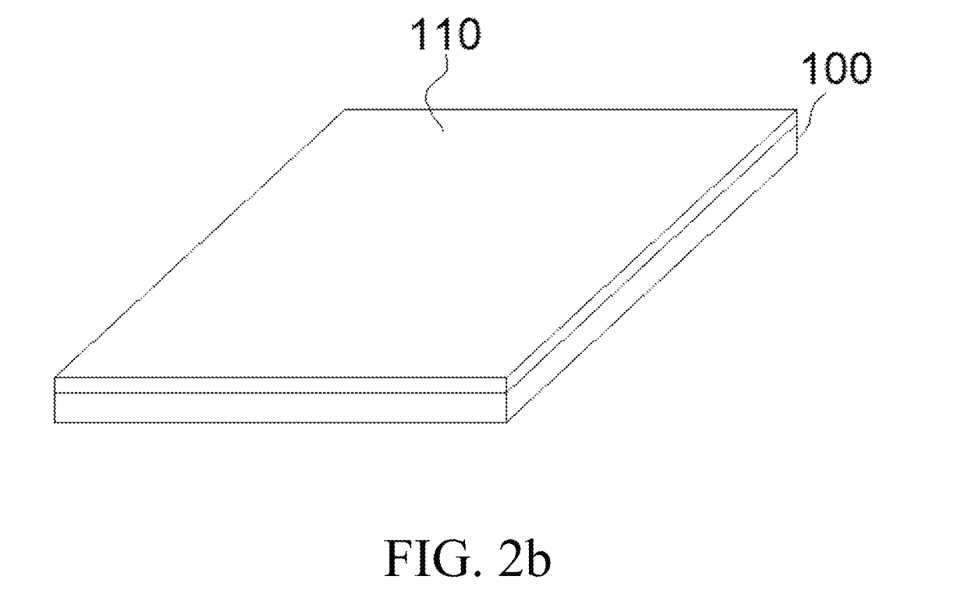
Figure 2C:
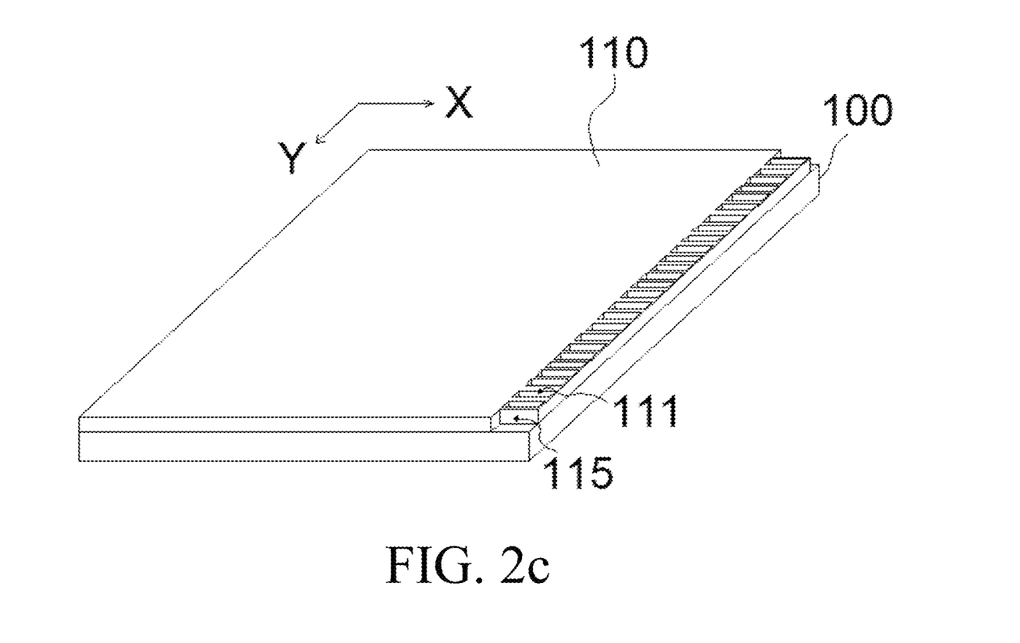
Figure 2D:
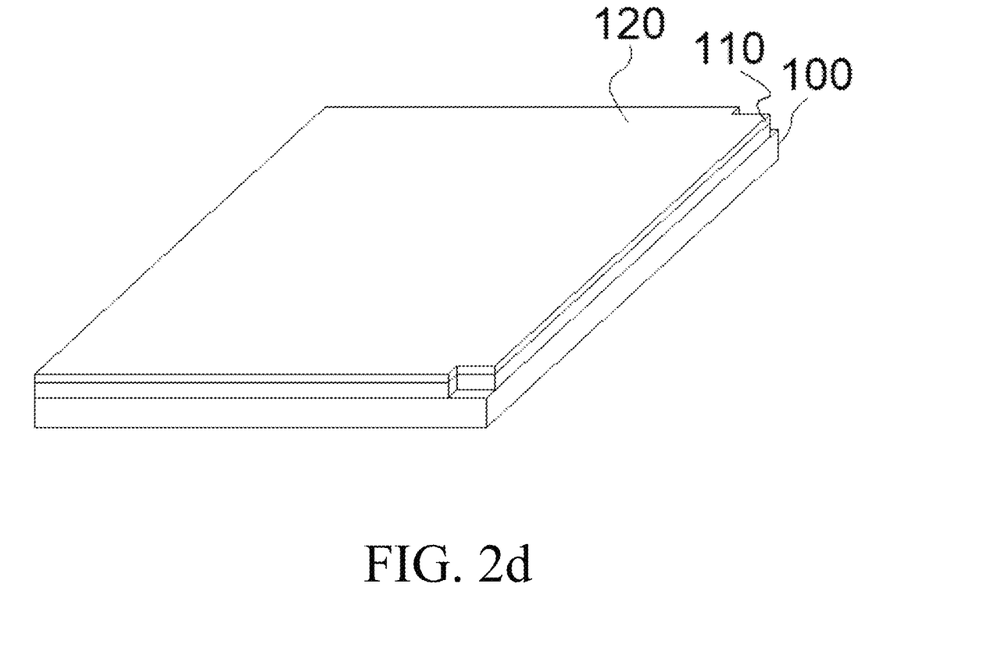
Figure 2E:
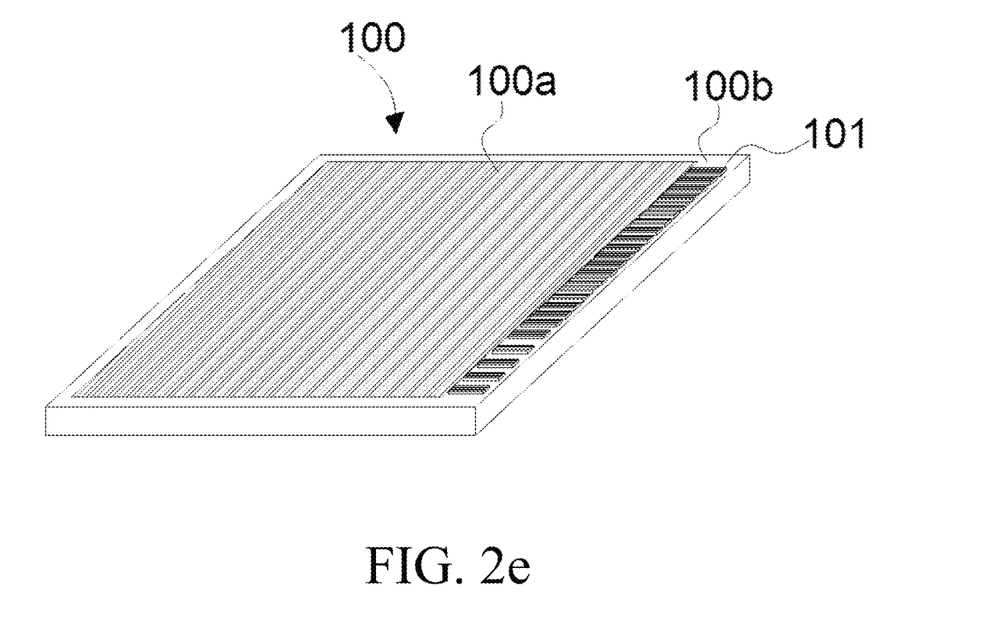

Please refer to FIG. 2a and FIG. 2e, the surface (front side) of the substrate 100 comprises an active area 100a and a non-active area 100b located outside the active area 100a. the slit 111 is arranged on the surface of the film 110 corresponding to the non-active area 100b, and the metal line 101 is formed in the non-active area 100b of the substrate 100. The function of the metal lines 101 is to connect the active area 100a and the bonding area on the back of the substrate 100 (not shown in the figure), and the conducting lines (not shown in the figure) are formed on the side walls of the substrate 100 by transfer printing or photolithography process. On the back of the substrate 100, connecting lines can be formed by the manufacturing method of the display panel, one end of the connecting line is connected to the bonding area, and the other end of the connecting line is connected to the conducting line, and one end of the conducting line away from the connecting line is connected to the metal line 101 to establish the transmission of the output signal of the bonding area to the active area 100a to achieve the conduction of the bonding area and the active area 100a. The Micro LED chip is electrically connected to the metal line 101 formed on the surface of the substrate 100 to realize the transfer of the Micro LEDs to the surface of the substrate 100.

In this embodiment, at least one side of the surface of the film 110, i.e. the side located in the non-active area 100b on the surface of the film 110, the non-active area 100b is in the shape of a box, a concave frame, an L-shaped frame or a straight shape. Please refer to FIG. 2a and FIG. 2e. The box is four sides of the non-active area 100b surrounding the active area 100a, and the slit 111 is arranged on the surface of the film 110 corresponding to at least one of the four sides of the box; the concave frame (not shown in the figure) is three sides of the non-active area surrounding the active area, and the slit is arranged on the surface of the film 110 corresponding to at least one of the three sides of the concave frame; the L-shaped frame (not shown in the figure) is two sides of the non-active area surrounding the active area, and the slit is arranged on the surface of the film 110 corresponding to at least one of the two sides of the L-shaped frame; the straight shape (not shown in the figure) is the non-active area and the active area arranged in sequence along the first direction X.

In the manufacturing method of the display panel provided by the present invention, the laser is employed to form the slits 111 on the surface of the film 110, and then the metal film 120 is deposited on the surface of the substrate 100 through the slits 111 and is cured to form metal lines 101. The damage of the metal film 120 can be effectively avoided, the formation quality of the metal line 101 can be ensured, and the stability of signal transmission can be ensured.

In this embodiment, referring to FIG. 2c, a shape of the slit 111 is a strip hole. The strip hole is arranged along a first direction X on the surface of the film 110. The number of the slits 111 is multiple, and the silts are arranged at intervals along a second direction Y, and the first direction X the second direction Y are perpendicular to each other. One end of the slit 111 extends toward the active area 100a, and the other end extends toward the side wall of the substrate 100. Correspondingly, the structure of the metal line 101 on the surface of the substrate 100 formed through the shape of the slit 111 as a strip hole is shown in FIG. 2e. A gap is left between one end of the metal line 101 away from the active area 100a and the adjacent side of the substrate 100.

Figure 4A:
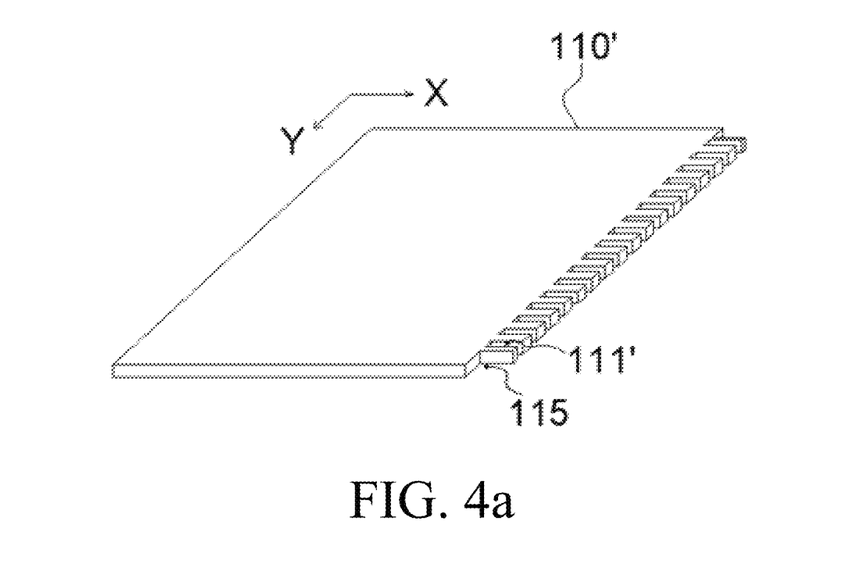
FIG. 4a is a structural diagram of a film provided by another exemplary embodiment of the present invention.
Figure 4B:
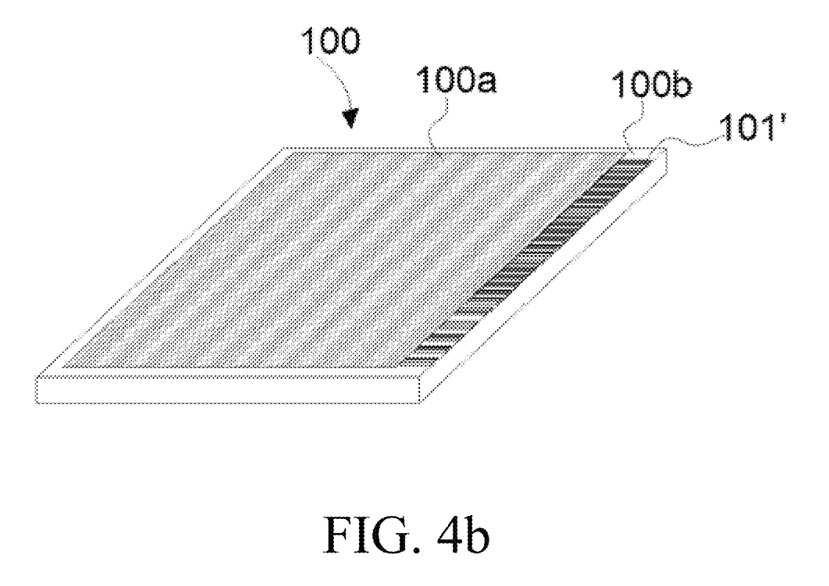
FIG. 4b is a structural diagram of a metal line formed on a substrate by a film provided by another exemplary embodiment of the present invention.

As an alternative improvement, referring to FIG. 4a, the shape of the silt 111' is a groove. Namely, a number of groove structures are formed on the side of the film 110' by laser. Correspondingly, referring to FIG. 4b, a metal line 101' is formed on the surface of the substrate 100 through the slit 111' of the groove structure and extends to the side of the substrate 100 at one end away from the active area 100a. With such design, when the conducting line is formed on the side wall of the substrate 100 by transfer printing or photolithography process, the conducting line can be directly connected to the end of the metal line 101' extending to the side of the substrate 100, thereby reducing the subsequent connecting process between the metal line 101' and the conducting line and shortening the process time.

Figure 5A:
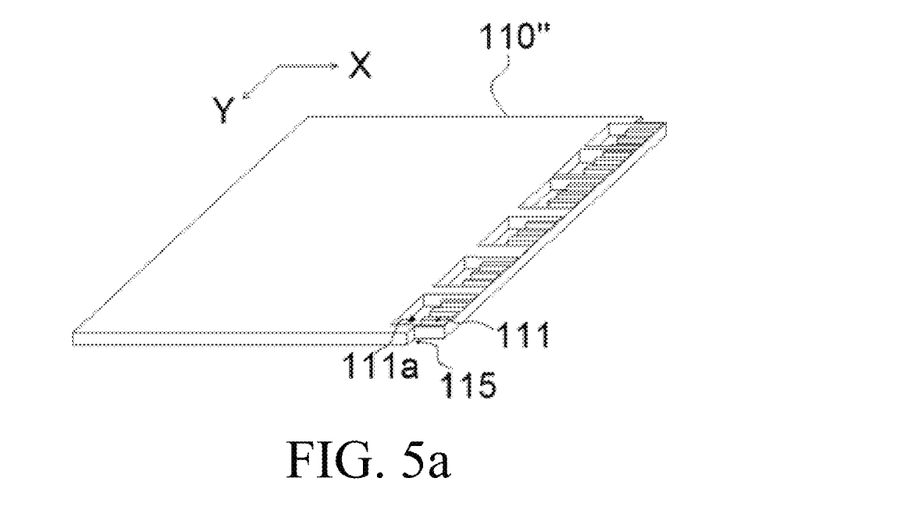
FIG. 5a is a structural diagram of a film provided by one another exemplary embodiment of the present invention.
Figure 5B:
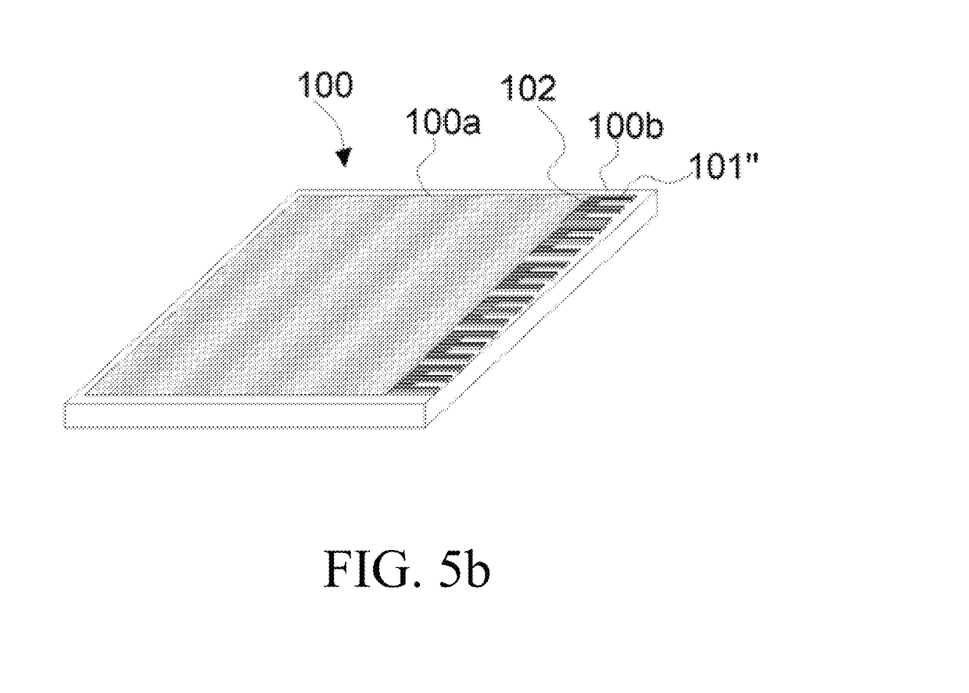
FIG. 5b is a structural diagram of a metal line formed on a substrate by a film provided by one another exemplary embodiment of the present invention.

As another alternative improvement, referring to FIG. 5a, a plurality of through holes 111a are formed on the surface of the film 110" corresponding to the non-active area 100b, and the through holes 111a are arranged along the second direction Y. With the plurality of through holes 111a arranged along the second direction Y, the through hole 111a exposes at least part of the non-active area 100b on the surface of the substrate 100, and the through hole 111a communicates with at least part of the inside of the slit 111. In this embodiment, one through hole 111a communicates with three slits 111. With such design, after the deposition of the metal film 120 is finished, the metal film 120 deposited in the through hole 111a and that in the corresponding slit 111 will communicate with one another. Please refer to FIG. 5b, the metal film 120 deposited in the through holes 111a forms bonding lines 102. The metal film 120 deposited in the slits 111 form metal lines 101". The metal lines 101" are connected to the active area 100a through the bonding lines 102. One bonding line 102 corresponds to three metal lines 101". Then, the parallel connection of multiple metal lines 101" on the surface of the substrate 100 is realized. With such design, the subsequent connection efficiency and connection contact area between the metal line 101" and the active area 100a can be improved.

As another alternative improvement, positioning marks 115 are at positions of at least two corners of the surface of the film 110. In the present invention, referring to FIG. 2c, FIG. 4a and FIG. 5a, the formation of the positioning marks 115 is to hollow out the corner positions of the film 110. In this embodiment, a positioning mark 115 is individually formed on the surface of the film 110 on both sides of the plurality of slits 111. The function of the positioning mark 115 is to provide positioning for the laser transmitter, and the laser transmitter positions the substrate 100 and the film 110 according to the positioning marks 115, and performs laser on the film 110 to form slits 111, which improves the process efficiency and shortens the process time. Certainly, the positions of the positioning marks 115 can be formed at any two adjacent corners or any two opposite corners, and the number of the positioning marks 115 can also be three or four.

As an alternative improvement, an alignment mark (not shown in the figure) corresponding to the positioning mark 115 is formed on the surface of the substrate 100. The alignment mark corresponds to the positioning mark 115, which facilitates the bonding between the array substrate and the color filter substrate in the subsequent manufacturing process of the display panel, and can be employed as a reference mark for forming other film layers on the surface of the substrate 100.

In summary, although the above preferred embodiments of the present application are disclosed, the foregoing preferred embodiments are not intended to limit the invention, those skilled in the art can make various kinds of alterations and modifications without departing from the spirit and scope of the present application. Thus, the scope of protection of the present application is defined by the scope of the claims.

What is claimed is:

1. A manufacturing method of a display panel, comprising following steps:
   providing a substrate, wherein the substrate comprises an active area and a non-active area located outside the active area;
   forming a film on a surface of the substrate;
   forming a plurality of slits on at least one side of a surface of the film corresponding to the non-active area, wherein the slits are arranged along a first direction and are formed on the surface of the film at intervals along a second direction that is perpendicular to the first direction, and the slits expose at least part of the non-active area of the surface of the substrate;

forming one or more through holes on the surface of the film corresponding to the non-active area, wherein the one or more through holes are arranged along the second direction, the one or more through holes expose at least part of the non-active area of the surface of the substrate, and each of the one or more through holes communicates with at least part of an inside of at least two adjacent slits;

forming a metal film on the surface of the film, wherein parts of the metal film corresponding to the slits and the one or more through holes are deposited on the surface of the substrate through the slits and the one or more through holes, respectively, and are cured, and rest of the metal film remains on the surface of the film; and removing the film and the metal film remaining on the surface of the film from the surface of the substrate, wherein after the film and the metal film remaining on the surface of the film are removed from the surface of the substrate, the deposited and cured parts of the metal film corresponding to the slits and the one or more through holes remain on the surface of the substrate to form a plurality of metal lines and one or more bonding lines in the non-active area, respectively; and wherein the one or more bonding lines are each connected to at least two adjacent metal lines, and the plurality of metal lines are connected to the active area through the one or more bonding lines, respectively.

2. The manufacturing method of the display panel according to claim 1, wherein a shape of the slits is a strip hole arranged along the first direction.

3. The manufacturing method of the display panel according to claim 1, wherein a shape of the slits is a groove arranged on a side of the film along the first direction.

4. The manufacturing method of the display panel according to claim 1, wherein the step of forming the film on the surface of the substrate further comprises forming positioning marks at positions of at least two corners of the surface of the film.

5. The manufacturing method of the display panel according to claim 4, wherein the manufacturing method further comprises forming alignment marks corresponding to the positioning marks on the surface of the substrate.

6. The manufacturing method of the display panel according to claim 1, wherein the film comprises a protective layer and a glue layer that are stacked, and the protective layer is formed on the surface of the substrate through the glue layer.

7. The manufacturing method of the display panel according to claim 6, wherein the protective layer is a polyimide film or a polyethylene terephthalate film.

8. The manufacturing method of the display panel according to claim 1, wherein a metal forming the metal film is selected from one of molybdenum, copper, molybdenum-titanium alloy or silver.

9. The manufacturing method of the display panel according to claim 1, wherein the plurality of slits are formed by laser, and the metal film is formed by physical vapor deposition (PVD).

10. The manufacturing method of the display panel according to claim 1, wherein the non-active area is in a shape of a box, a concave frame, an L-shaped frame or a straight shape.

* * * * *